United States Patent Office 3,231,500
Patented Jan. 25, 1966

3,231,500
SEMICONDUCTING PERYLENE COMPLEXES OF INORGANIC HALIDES

Martin S. Frant and Roger Eiss, Harrisburg, Pa.
No Drawing. Filed Oct. 9, 1962, Ser. No. 229,496
2 Claims. (Cl. 252—62.3)

This invention relates to semiconductor materials, to methods for making the same, and to devices and methods utilizing these materials. In particular, the invention relates to organic semiconductor materials, to methods of making these materials, and to methods and devices utilizing these materials.

Semiconductor materials, well known to the inorganic chemist, are materials whose conductivity properties are intermediate between those of electrical conductors and those of electrical insulators. For example, an insulating compound such as polystyrene has a conductivity of about $10^{-22}$ mho/cm. and a conducting material such as mercury has a conductivity of about $10^5$ mho/cm., whereas semiconducting materials generally have a conductivity between about 1 and about $10^{-15}$ mho/cm. For example, the inorganic semiconducting element germanium has a conductivity of about $10^{-1}$ mho/cm.

The number of semiconducting elements and compounds in inorganic chemistry is fairly limited as compared with the vast number of compounds possible in organic chemistry. Thus, there has been considerable interest in the art in preparing organic semiconducting compounds since a wider spectrum of semiconducting properties would then be available to the art. Because the properties of organic compounds can be subtly changed by alteration in their structure, the development of suitable organic semiconducting materials would permit the fabrication of devices employing these materials, which devices could be "tailor-made" to particular specifications by appropriate chemical alteration of the structure of the organic material therein. Also, many effective techniques for purifying organic compounds are well-known in the art and could be used to avoid the complex and expensive purification steps now necessary in preparing inorganic semiconductors.

According to the present invention, a number of new organic semiconducting materials have been prepared. More importantly, it has been discovered that materials can be prepared having n-type conductivity and p-type conductivity, and that p-n junctions can be formed between these materials. As known in the art, particularly in that art relating to the chemistry of germanium and silicon, semiconducting bodies, particularly those containing p-n junctions, can be employed in the fabrication of numerous devices for translating electrical current.

These concepts and this terminology have achieved currency in the art. Thus, a "p-type" semiconductor material is known to those skilled in the art as a semiconductor in which the conduction of an electrical current is accomplished by the movement of "holes" or positively charged electron-deficient sites through an atomic or molecular latice. Conversely, an "n-type" semiconductor material is one in which an electrical current is conducted by a flow of electrons through the material. A "p-n junction" is a boundary or interface between materials of n-type and p-type conductivity. Devices translating electrical current include resistors, varistors, transistors, transducers, rectifiers including point-contact rectifiers, and other, diode, triode, and more complex electrical devices altering, in some characteristic, an electrical current flowing therethrough.

The organic semiconductor materials of the present invention are organic molecular complexes formed between a plurality of molecules. Since certain of these complexes are formed between an organic material and inorganic metallic and non-metallic atoms and/or molecules, the term "organic molecular complex" as used herein should be read to include complexes between organic compounds and such inorganic materials. Since, in every case, the resulting complex has an organic component, such terminology is by no means contrary to the art.

In particular, the organic molecular complexes of the present invention are complexes formed between aromatic compounds having a plurality of conjugated double and single bonds, as in aromatic fused-ring compounds, which act as electron donor materials in the formation of the complexes, and other organic or inorganic molecules acting as electron acceptors and combining with the donor material to form a complex. Particularly interesting complexes have been formed in which aromatic hydrocarbon fused-ring compounds, that is aryl materials and alkyl-substituted aryl compounds, are the donor substances. Suitable electron acceptor materials include organic compounds such as tetracyanoethylene, and inorganic molecules containing elements from groups IIB, IIIA, IVA, VA, VB, VIB, VIIA, and VIII of the Periodic Table.

Molecular complexes having particularly desirable properties have been formed between perylene and iodine, or between perylene and inorganic halides such as molybdenum chloride, nickel chloride, cadmium chloride, cadmium iodide, aluminum chloride, arsenous chloride, phosphorus pentachloride, antimony trichloride, ferrous chloride, ruthenium chloride, platinic chloride, niobium chloride, osmium chloride, indium trichloride, phosphorus trichloride, palladium chloride, iodine monochloride, and silicon tetrachloride. These materials all have conductivities within the semiconductor range: for example, the perylene-iodine complex has a conductivity of about $9\times10^{-3}$ mho/cm. at 30° C., whereas the conductivity of a material such as cadmium chloride is about $5\times10^{-13}$ mho/cm. The materials are of particular interest in the manufacture of devices offering resistance to the passage therethrough of an electrical current, and can be employed for example in the manufacture of thin film resistors of a type known to the art and comprising a thin film of a poorly conducting material on an insulating base such as of a ceramic.

Of special interest are complexes formed between perylene and ferric chloride, since these complexes can be made in a manner such that the final material obtained has either n-type conductivity or p-type conductivity. Whereas organic compounds in general, including most of the complexes mentioned above, have p-type conductivity exclusively, the discovery that the perylene-ferric chloride complexes can be produced in both n and p form makes possible the manufacture of bodies having one or more p-n junctions therein, and the utilization of such bodies in the manufacture of electrical translating devices utilizing p-n junctions to modify the flow of an electric current passing through such devices.

The organic molecular complexes of the invention are formed by contacting the individual components. For example, a mixture of solid components may be fused and the complex recovered on cooling. Or the components may be contacted in a mutual solvent or mixture of solvents inert to the reactants and reaction product. In view of the aromatic nature of some of the preferred components of the complexes, such compounds are suitably dissolved in an organic solvent. The choice of the solvent or solvents employed in this method of manufacture is not critical, and aliphatic, cycloaliphatic, or aromatic materials such as hexane, heptane, cyclohexane, benzene, toluene, dioxane, ethers, etc. can be employed. The same solvents can be employed for other organic components of the complexes such as tetracyanoethylene. When a component of a complex is an inorganic material, it may suitably be dissolved in a solvent which is the same as, or miscible with, the solvent employed to dissolve organic components of the complex. Although the inorganic materials employed according to the invention are soluble to some extent in the organic solvents above-mentioned, their solubility is greatest in polar solvents such as ethers and other solvents containing oxygen and/or other polar groups. Solutions of the two components of the complex may be separately prepared and then mixed. Alternatively, a solution of at least one of the components may be prepared and other components added directly to this solution. Formation of the complexes in a solution is facilitated by choosing a solvent in which the complex formed is insoluble. In such methods, the complex is formed simply on standing as a dark colored black or brownish black precipitate. Interestingly, the semiconducting complexes of the invention are usually dark in color, suggesting that the complexes show strong electronic interaction and contain unpaired electrons.

The structure of the semiconducting organic molecular complexes of the invention is not known. However, the complexes are formed when substantially equimolar quantities of the components are brought together in solution, and will similarly form if one or the other component is in excess.

Indeed, a preferred mode of preparation of the n-type and p-type perylene-ferric chloride complexes mentioned above as being of particular interest is by forming the complex in the presence of an excess of one or the other of the components. When ferric chloride is in excess in a solution containing this material and perylene, the complex precipitated from the solution has n-type characteristics. On the other hand, if perylene is in excess during the synthesis of the complex, the resulting precipitated material is p-type. By "excess," in this context, is meant an amount of material greater than that required for equimolecular stoichiometry. It is not clear whether the excess perylene in a p-type material or the excess ferric chloride in an n-type material is to be considered an impurity (in the sense in which this term is employed in the art of inorganic semiconductors) in a single perylene-ferric chloride complex of fixed composition, or whether an excess of one or the other materials promotes the formation of a complex compound different from the complex obtained when no excess of either ingredient is present.

Since p- or n-type conductivity in the perylene-ferric chloride material is linked with the presence in the material of an excess of one or the other component, the phenomenon can be utilized to prepare perylene-ferric chloride bodies having a p-n junction therein. For example, a body of n-type material formed in the presence of an excess of ferric chloride can be treated selectively to introduce excess perylene into a portion thereof to convert the treated portion to a p-type material. For example, perylene, suitably in vapor form, may be selectively diffused into a portion of a body of this type. Conversely, the body of n-type perylene-ferric chloride complex may be treated selectively to remove excess ferric chloride from a portion thereof to leave an excess of perylene therein, whereby the n-type material is converted to a p-type material.

Alternatively, a body of p-type perylene-ferric chloride complex prepared in the presence of an excess of perylene may be selectively treated, for example with a solution of ferric chloride, to introduce an excess of ferric chloride into a portion of the body and to convert it to n-type material. Again, conversely, such a p-type body can be treated to remove excess perylene from a portion thereof to convert it to n-type material having an excess of ferric chloride therein. In each instance, a p-n junction will be formed in the body. It will be evident to those skilled in the art that a plurality of p-n type junctions can be created in the same body, for example by diffusing perylene into either end of an extended body of n-type material. By techniques analogous to those employed in the semiconductor arts with inorganic materials, p-n-p junctions, n-p-n junctions, and the like may be formed. Since electron and hole mobility is relatively low in organic semiconductors as compared with charge mobility in inorganic materials, the organic semiconductors are particularly suited for use in devices, such as rectifiers, for use at low electrical frequencies. [A typical rectifier employing a rectifying p-n junction is shown as Fig. 5–16 of "Semiconductor Devices," by John N. Shive, D. Van Nostrand Co., Inc., Princeton (1959).]

Though charge mobility in these materials is low, their conductivity indicates that there are many charge carriers and a large reservoir of carriers. This is deduced from the observation that, except for the materials of the invention having the highest conductivity, there is a linear relationship between conductivity and activation energy (see Table I infra).

Modification of the molecular structure of a material such as perylene, for example by the substitution of alkyl groups or functional groups of a wide variety, will affect the electronic configuration of the organic compound and bring about modification in the semiconductor properties of complexes formed with the substituted or otherwise modified materials.

As mentioned earlier, the materials of the present invention can be usefully employed to form devices such as thin film resistors. Although the complexes, on the whole, are relatively intractable materials, e.g., relatively insoluble high melting solids, the individual components of the complex are relatively easy to handle. This situation suitably adapts the materials of the present invention to the use of deposition or impregnation techniques in the fabrication of devices in which film of the complex is formed on a suitable base in situ. For example, a material such as perylene may be deposited from a solution onto an insulating base, such as of a ceramic material, or may be used to impregnate a porous body. Alternatively, the relatively volatile perylene may be condensed from the vapor phase on a cold insulating body. The perylene-coated bodies may then be contacted with a component complexing with the perylene to form the semiconducting complexes of the invention. Volatile complexing components such as iodine or tetracyanoethylene may be contacted in the vapor phase with the perylene-coated bases, for example. Relatively involatile materials such as certain metal halides may be contacted with the perylene while in solution, for example. A particularly useful variation of this method involves the contacting of the complexing ingredients while an electrical current is passed through the first-deposited ingredient, resistivity measurements being taken during the contacting step. As the complex forms in situ, the resistivity of the original film of complexing ingredient will change, and the contacting process may be interrupted when the desired resistivity has been reached.

The distinctive electrical properties of the molecular complexes of the present invention are evident with the materials in either polycrystalline or in single crystal form. Compressed polycrystalline pellets of the material, for example, may be used in the fabrication of resistors and like electrical translating devices. A distinct advantage of the organic materials of the present invention over inorganic semiconductors is the ease of making ohmic contact with the organic materials. Whereas complicated techniques are often necessary to make ohmic contact with an inorganic semiconducting body such as of silicon or germanium, ohmic contact with the organic semiconductors of the invention can often be simply and effectively made merely by pressure contact of an electrode with a body of the material.

A better understanding of the invention and of its many advantages will be had by referring to the following specific examples, given by way of illustration.

*Example 1*

Perylene was prepared by gently warming a mixture of 25 gms. of di-$\beta$-naphthol, 25 gms. of phosphorous acid, and 25 gms. of phosphorus pentachloride in a 250 ml. distilling flask. When foaming ceased and phosphine (which burns on contact with air) ceased to be given off, the flask was heated strongly with a Meeker burner until distillation of the crude product was complete. The product was then purified by repeated precipitation from benzene until it showed a melting point of 265° C.

*Example 2*

This example, and following Examples 3–7 show typical procedures for the preparation of typical complexes according to the present invention. However, it should be understood that alternative techniques can be employed to prepare the specific compounds here shown, or other complexes.

1 gm. of perylene and 3.5 gms. of iodine were dissolved in 100 ml. of hot benzene (70–75° C.) and slowly cooled to room temperature. A black precipitate appeared on cooling. The precipitate was collected on a suction filter, washed with cold benzene, and dried in a suction filter. Chemical analysis showed that the complex compound formed had a slightly higher iodine content than would be predicted for a complex containing perylene:iodine in a ratio of 1:1.5. This may be caused either by an excess of iodine or by a small amount of a 1:3 complex which may possibly be formed.

*Example 3*

A solution of 1 gm. of perylene and 3 gms. of iodine monochloride in 100 ml. of hot benzene (70–75° C.) was slowly cooled to room temperature. A brownish black precipitate appeared on cooling and was recovered as in Example 2.

*Example 4*

2 gms. of perylene were dissolved in 200 ml. of hot benzene. In a separate container 4 gms. of anhydrous ferric chloride were dissolved in 100 ml. of dry ether. The solutions were poured together, mixed, and permitted to cool. A brownish black precipitate was formed which was filtered, washed, and dried as described above. The material, prepared from a solution containing an excess of ferric chloride (as compared with equimolar stoichiometry), was an n-type material.

*Example 5*

The preparation of a perylene:ferric chloride material according to Example 4 was repeated, except that perylene was in excess in a ratio of 1:0.7, as compared with the ferric chloride. The resulting complex showed p-type conductivity.

*Example 6*

2 gms. of perylene were dissolved in 200 ml. of hot benzene. 4 gms. of stannic chloride were added directly to this solution. The solution was cooled, and the light brown precipitate was filtered, washed, and dried as in the previous examples.

*Example 7*

1 gm. of perylene was dissolved in 100 ml. of hot benzene. In another container 4 gms. of tetracyanoethylene were dissolved in 100 mls. of the same solvent. The two solutions were poured together with stirring and cooled. The dark green precipitate formed on cooling was filtered, washed, and dried.

*Example 8*

On diffusion of perylene vapors into a body of the n-type conducting perylene-ferric chloride shown in Example 4 above, a p-n junction is formed in the body. Conversely, when the p-type conducting perylene-ferric chloride complex of Example 5 is contacted with ferric chloride, a p-n junction is formed. A device for rectifying electrical current is obtained on making ohmic contact to the p-type and n-type portions of these bodies.

*Example 9*

An insulating ceramic base is coated with perylene by deposition of perylene vapors onto the cooler ceramic. The coated base is next exposed to vapors of iodine, whereupon an electrically resistant film comprising a semiconducting complex of perylene and iodine is formed on the ceramic base.

Whether a semiconducting body has n-type or p-type conductivity is conveniently determined by detecting the polarity of the thermoelectric voltage developed between a hot junction of the body and a metal. If the charge carriers in the semiconductor are predominantly electrons, the cold junction becomes negatively charged; if the carriers are predominantly positive holes, the cold junction becomes positively charged. This method was employed in detecting the conductivity type of the materials mentioned herein.

Table I below reports the conductivity at about 300° K. and activation energy (calculated from measured variations in conductivity with temperature) for a number of typical materials disclosed herein.

TABLE I

| Compound Complexed with Perylene | Activation Energy (Electron Volts) | Conductivity at 300° K. (mho/cm.) |
|---|---|---|
| $I_2$ | 0.095 | $7.8\times10^{-3}$ |
| ICl | 0.17 | $2\times10^{-5}$ |
| $SbCl_5$ | 0.17 | $1.7\times10^{-3}$ |
| $SbCl_3$ | 0.53 | $3\times10^{-10}$ |
| $InCl_3$ | 0.28 | $4\times10^{-5}$ |
| $FeCl_3$ (p-type) | 0.19 | $9\times10^{-5}$ |
| $FeCl_3$ (n-type) | 0.20 | $1.5\times10^{-5}$ |
| $PCl_5$ | 0.53 | $1.2\times10^{-10}$ |
| $PCl_3$ | ---------- | $1\times10^{-13}$ |
| $CdCl_2$ | ---------- | $1\times10^{-13}$ |
| $CdI_2$ | ---------- | $1\times10^{-12}$ |
| $AsCl_3$ | ---------- | $1\times10^{-12}$ |
| $AlCl_3$ | ---------- | $1\times10^{-13}$ |
| $C_2H_2(CN)_4$ | ---------- | $1\times10^{-14}$ |
| $OsCl_3$ | 0.60 | $3\times10^{-11}$ |
| $RuCl_3$ | 0.37 | $3\times10^{-8}$ |
| $FeCl_2$ | 0.25 | $2\times10^{-6}$ |
| $PtCl_4$ | 0.50 | $1\times10^{-7}$ |
| $NiCl_2$ | ---------- | $1\times10^{-11}$ |
| $MoCl_5$ | ---------- | $1\times10^{-13}$ |

Although specific embodiments have been described in the examples and shown in the drawings, and although various preferences, recommendations, and alternatives have been given, it is to be understood that these are not exhaustive or limiting of the invention, but are illustrative and for the purpose of instructing others in the principles of the invention and how to modify it so that they may be able to use it in a variety of embodiments as best suited to the conditions and requirements of a particular use.

What is claimed is:

1. An electrically semiconducting molecular complex of perylene and an inorganic halide selected from the group consisting of chlorides and iodides of aluminum, arsenic, cadmium, ferrous iron, indium, molybdenum, nickel, niobium, osmium, palladium, platinum, phosphorus, ruthenium, and silicon.

2. An n-type semiconducting complex of perylene and ferric chloride in which said ferric chloride is present in excess of an equimolar amount.

References Cited by the Examiner

UNITED STATES PATENTS

| | | | |
|---|---|---|---|
| 2,725,316 | 11/1955 | Fuller | 148—186 |
| 2,762,730 | 9/1956 | Alexander | 148—186 |
| 2,778,802 | 1/1957 | Willardson et al. | 252—62.3 |
| 3,078,233 | 2/1963 | Martin | 252—62.3 |

OTHER REFERENCES

Labes et al.: "The Electrical Resistivity of Organic Molecular Complexes," The Journal of Chemical Physics, volume 33, No. 3, September 1960, pages 868–872.

TOBIAS E. LEVOW, *Primary Examiner.*

HYLAND BIZOT, MAURICE A. BRINDISI, *Examiners.*

UNITED STATES PATENT OFFICE

CERTIFICATE OF CORRECTION

Patent No. 3,231,500 January 25, 1966

Martin S. Frant et al.

It is hereby certified that error appears in the above numbered patent requiring correction and that the said Letters Patent should read as corrected below.

In the grant, lines 1 to 3, for "Martin S. Frant and Roger Eiss, of Harrisburg, Pennsylvania," read -- Martin S. Frant and Roger Eiss, of Harrisburg, Pennsylvania, assignors to AMP Incorporated, of Harrisburg, Pennsylvania, a corporation of New Jersey, --; line 12, for "Martin S. Frant and Roger Eiss, their heirs" read -- AMP Incorporated, its successors --; in the heading to the printed specification, line 4, for "Martin S. Frant and Roger Eiss, Harrisburg, Pa." read -- Martin S. Frant and Roger Eiss, Harrisburg, Pa., assignors to AMP Incorporated, of Harrisburg, Pa., a corporation of New Jersey --.

Signed and sealed this 3rd day of January 1967.

(SEAL)
Attest:

ERNEST W. SWIDER
Attesting Officer

EDWARD J. BRENNER
Commissioner of Patents